United States Patent
Chen et al.

(10) Patent No.: US 6,278,641 B1
(45) Date of Patent: Aug. 21, 2001

(54) METHOD AND APPARATUS CAPABLE OF PROGRAMMABLY DELAYING CLOCK OF DRAM

(75) Inventors: Chia-Hsin Chen; Jiin Lai, both of Taipei (TW)

(73) Assignee: Via Technologies, Inc., Taipei Hsien (TW)

(*) Notice: Subject to any disclaimer, the term of this patent is extended or adjusted under 35 U.S.C. 154(b) by 0 days.

(21) Appl. No.: 09/578,234

(22) Filed: May 24, 2000

(30) Foreign Application Priority Data

Oct. 19, 1999 (TW) .................................................. 88118042

(51) Int. Cl.[7] ...................................................... G11C 7/00
(52) U.S. Cl. .................... 365/194; 365/233; 365/189.02; 327/259
(58) Field of Search ..................................... 365/194, 233, 365/189.02; 327/259, 243, 244

(56) References Cited

U.S. PATENT DOCUMENTS 5,801,566 * 9/1998 Tanaka .................................. 327/259
6,081,462 * 6/2000 Lee ....................................... 365/194

* cited by examiner

Primary Examiner—David Nelms
Assistant Examiner—David Lam
(74) Attorney, Agent, or Firm—Jiawei Huang; J. C. Patents

(57) ABSTRACT

An apparatus and method capable of programmably delaying a clock of a memory. The apparatus and method utilize the BIOS, external electric switches or other logic devices to selectively delay the clock of the DRAM and/or the internal clock of the north bridge, by which the DRAM has enough setup time at the rising edge of work clock to correctly read out the command word. The north bridge can then correctly receive data from the DRAM module and transfer the data to the CPU or AGP. Therefore, the memory can function normally even if the memory is operated at high speed or with heavy loading.

15 Claims, 3 Drawing Sheets

METHOD AND APPARATUS CAPABLE OF PROGRAMMABLY DELAYING CLOCK OF DRAM

CROSS-REFERENCE TO RELATED APPLICATION

This application claims the priority benefit of Taiwan application serial no. 88118042, filed Oct. 19, 1999.

BACKGROUND OF THE INVENTION

1. Field of Invention

The present invention relates to a method and apparatus for accessing data from a dynamic access random memory (DRAM) of a computer. More particularly, the present invention relates to a method and apparatus capable of programmably delaying a clock of memory.

2. Description of Related Art

The main memory of a computer, such as a personal computer (PC), is used for storing data or information, which can be accessed by a central processing unit (CPU) of the PC. Namely, data can be stored within and read from the main memory and furthermore, program and data are executed or processed within the memory. Accompanying highly developed semiconductor technology, it is common for a modem PC to have tens or hundreds of megabytes (MB) of memory. In addition, the clock frequency of the memory rises up to 100 MHz or higher as the clock frequency of the CPU continuously increases.

As the clock frequency of the memory rises, the clock period of the memory is shortened. In addition, the clock sent from the north bridge (NB) of a PC is transmitted to the memory module, which is delayed when it passes through a transmission path on a print circuit board (PCB). When a memory module senses the command word asserted by the NB according to the rising edge of the clock, the memory module can't correctly read the command word because there is not enough setup time, which causes the PC to malfunction.

FIG. 1 is a schematic block diagram of a north bridge (NB) and DRAM module of a conventional PC. As shown in FIG. 1, the NB 10 comprises a phase locked loop (PLL) circuit 11 having two inputs for respectively receiving a command output clock signal (DCLK) and a feedback input clock signal (DCLKIN), which both have the same phase and frequency, and an output for outputting a bus output clock signal (DCLKO), which has the same frequency of DCLK but leads the DCLK by one phase. DCLKO is transmitted to the DRAM module 20 through a transmission path, and is fed back to PLL circuit 11 by the transmission path serving as signal DCLKIN. Because the transmission delay is substantially equal, the frequency and phase of DCLKIN detected at the input of PLL circuit is substantially equal to those of the memory input clock signal (CLK_DM) detected at the DRAM module 20.

FIG. 2A depicts a timing diagram of the north bridge when the north bridge accesses the DRAM module according to a conventional PC architecture. The command output clock signal DCLK is sent from the north bridge. Referring to FIGS. 1, 2A and 2B, at time T1, the north bridge 10 asserts a command word (CMD) to DRAM module 20, and the phase of the command word received at the DRAM module 20 is slightly delayed due to the transmission delay. As a result, there is not enough setup time while the DRAM module 20 tries to sense the command word CMD_DM at the rising edge of time T2 of memory input clock signal CLK_DM. This makes it impossible for the DRAM module 20 to send out correct data at time T3. Furthermore, the NB also lacks sufficient setup time to sense and read data from DRAM module 20 due to the transmission delay. Therefore, the NB 10 is unable to sense and read data from DRAM module 20. The situation is more serious when the memory is operated at a high speed or with heavy loading.

SUMMARY OF THE INVENTION

The invention provides an apparatus capable of programmably delaying a clock of a DRAM. The clock of the DRAM or the internal clock of the north bridge can be selectively delayed or not by means of the basic input output system (BIOS), external electric switches or other logic devices. Therefore, the DRAM module has enough setup time at the rising edge of a work clock to correctly read the command word. The north bridge can then correctly receive data from the DRAM module and transfer the data to the CPU or an accelerating graphic port (AGP).

The invention provides an apparatus capable of programmably delaying a clock of a DRAM. The clock of the DRAM can be selectively delayed or not by means of the BIOS, external electric switches or other logic devices. Therefore, the DRAM module has enough setup time at the rising edge of the work clock to correctly read out the command word, by which a computer can function normally.

The invention provides a method capable of programmably delaying a clock of a DRAM. The clock of the DRAM or the internal clock of the north bridge can be selectively delayed or not by means of the BIOS, external electric switches or other logic devices. Therefore, the DRAM module has enough setup time at the rising edge of the work clock to correctly read out the command word. The north bridge can then correctly receive data from the DRAM module and transfer the data to the CPU or AGP.

The invention provides an apparatus capable of programmably delaying a clock of a DRAM, which is suitable for a chipset, such as a north bridge chipset (north bridge or NB). The apparatus comprises a first delay means for delaying the output of a first internal clock signal by selecting an adequate delay time; a second multiplexer for selecting a second internal clock signal; a third multiplexer for selecting an adequate delay time to output the second internal clock signal; a fourth multiplexer for selecting an adequate delay time to output the first internal clock signal; and a phase locked loop (PLL) circuit for receiving the adequately delayed first and second internal clock signals to output a first output clock signal. The first output clock signal is generated according to the first internal clock signal which is adequately delayed or not delayed and the second internal clock signal which is adequately delayed or not delayed. Whether or not the clock of the DRAM and the internal clock signals are delayed is determined by setting select signals of the multiplexers within the north bridge by means of the BIOS, external switches or other logic circuits. Therefore, the DRAM has enough setup time at the rising edge of the work clock to correctly read the command word. Accordingly, the north bridge can correctly receive data from the DRAM and then transfer the data to the CPU or AGP.

The invention provides an apparatus capable of programmably delaying a clock of a DRAM, which is suitable for a chipset, such as a north bridge. The apparatus comprises a first delay circuit for receiving a command output clock signal to select an adequate delay time to output the command output clock signal; a first multiplexer for receiving the command output clock signal and a feedback input clock signal and then selecting one of them; a second delay circuit coupling to the output of the first multiplexer for adequately delaying the output signal of the first multiplexer; a third delay circuit, for receiving the feedback input clock signal to select an adequate delay time to output the feedback input clock signal; and a phase locked loop circuit for receiving the adequately delayed command output clock signal and the adequately delayed feedback input clock signal and outputting a bus output clock signal to the DRAM. Selection of an adequate delay of the clock of the DRAM is made by setting select signals of the multiplexers within the north bridge by means of the BIOS, external switches or other logic circuits. Therefore, the DRAM has enough setup time at the rising edge of the work clock to correctly read the command word. Accordingly, the north bridge can correctly receive the data from the DRAM and then transfer the data to the CPU or AGP.

The method according to the present invention can be applied to a chipset which comprises signals of command output clock, feedback input clock and bus input clock, wherein the bus input clock signal is used for outputting to the DRAM. Furthermore, the method comprises the steps of selecting an adequately delayed command output clock signal, selecting an adequately delayed reference clock signal, selecting an adequately delayed feedback input clock signal, and inputting the adequately delayed command output clock signal and a feedback input clock signal to a PLL circuit, by which an adequately delayed bus output clock signal is generated. Therefore, the DRAM has enough setup time at the rising edge of the memory input clock signal because of the adequately delayed bus output clock signal and reference clock signal. The method for selecting the adequately delayed reference clock signal RCLK, feedback input clock signal and command output clock signal can utilize the BIOS to setup a plurality of select signals.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention provides a method and apparatus capable of programmably delaying a clock of dynamic random access memory (DRAM). By means of a basic input/output system (BIOS), external electric switch or other logic controlling circuit, the clock of the DRAM can be selectively delayed or not, by which the DRAM has enough setup time at the rising edge of the clock to correctly read out a command word.

Figure 3:
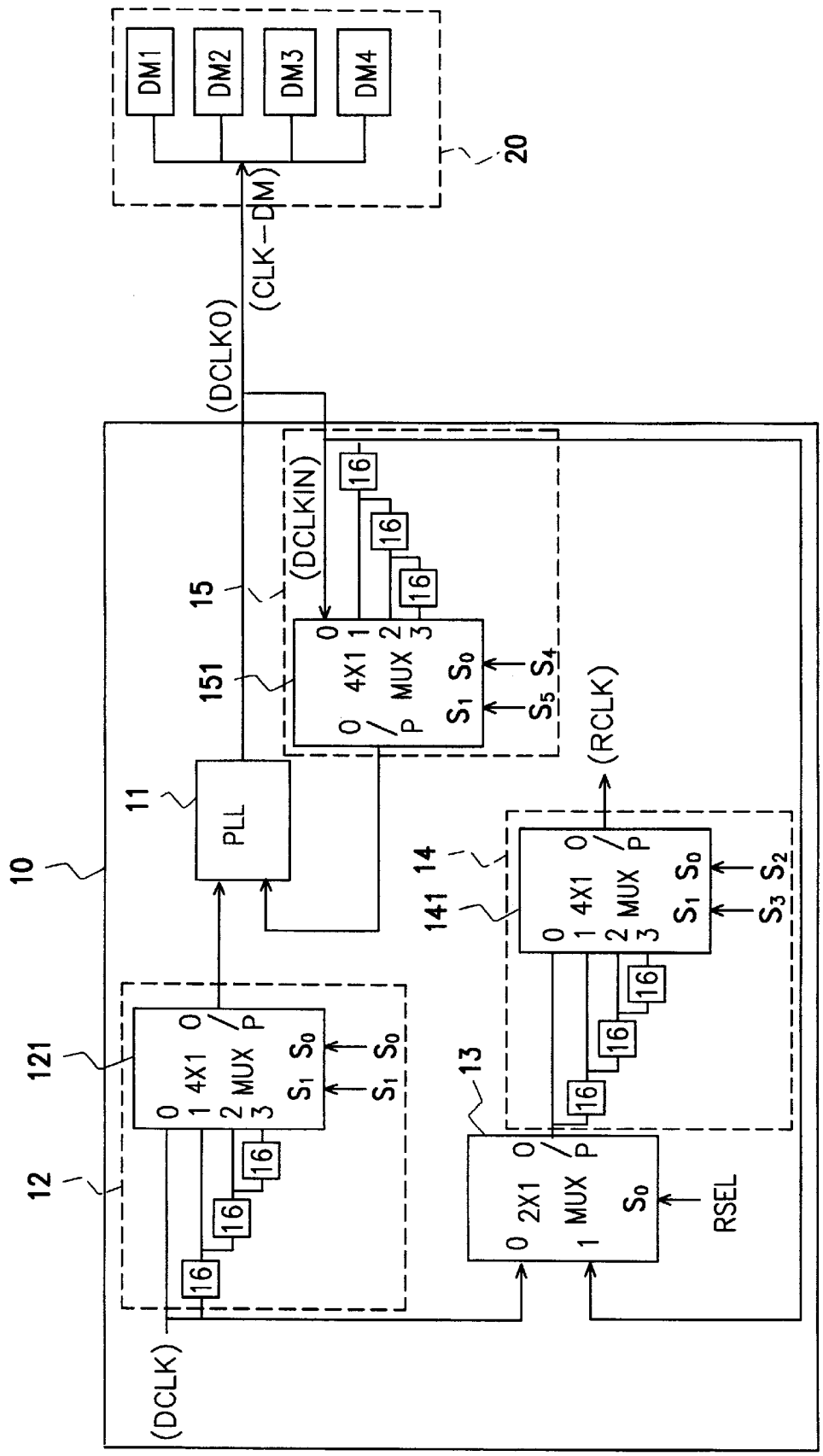
FIG. 3 is a block diagram showing the connection between the north bridge and the DRAM of the apparatus capable of programmably delaying clock of DRAM according to the preferred embodiment of the present invention.

FIG. 3 is a schematic block diagram showing the connection between a north bridge and a DRAM of the apparatus capable of programmably delaying clock of DRAM according to the preferred embodiment of the present invention. Referring to FIG. 3, the apparatus capable of programmably delaying a clock of DRAM comprises a phase locked loop (PLL) circuit 11, a first delay circuit 12, a first multiplexer 13, a second delay circuit 14 and a third delay circuit 15. Two inputs of the PLL circuit 11 respectively couple to the outputs of the first and the third delay circuits 12, 15. The first delay circuit 12, for example, may comprise a multiplexer 121 and a plurality of unit delay circuits 16. In the embodiment, a 4×1 multiplexer comprising four inputs and two select signals is used for an exemplary detail description, which does not limit the scope of the present invention. The multiplexer 121 comprises a first input (pin 0) which is used to receive a command output clock signal (DCLK), a second input (pin 1) coupling to the first input (pin 0) through a unit delay circuit 16, a third input (pin 2) coupling to the second input (pin 1) through a unit delay circuit 16, and a fourth input (pin 3) coupling to the third input (pin 2) through a unit delay circuit 16. The select signals S0 and S1 of the multiplexer 121 are used for selecting the command output clock signal DCLK, which has no delay, one-unit delay, two-unit delay or three-unit delay, to input to the PLL circuit 11.

Still referring to FIG. 3, the first multiplexer 13, such as a 2×1 multiplexer, has two inputs (pin 0 and 1), which are used for receiving the command output clock signal DCLK and the feedback input clock signal DCLKIN, respectively. The first multiplexer 13 can select one of the signals DCLK and DCLKIN as an input to the second delay circuit 14 according to a select signal RSEL. Accordingly, the second delay circuit 14 can select a reference clock signal (RCLK) that has been adequately delayed.

The second delay circuit 14 comprises a multiplexer 141 and a plurality of unit delay circuits 16. According to the embodiment, a 4×1 multiplexer comprising four inputs and two select signals is used for an exemplary detailed description, which does not limit the scope of the present invention. The multiplexer 141 comprises a first input (pin 0) coupling to the output of the first multiplexer 13, a second input (pin 1) coupling to the first input (pin 0) through a unit delay circuit 16, a third input (pin 2) coupling to the second input (pin 1) through a unit delay circuit 16, and a fourth input (pin 3) coupling to the third input (pin 2) through a unit delay circuit 16. The select signals S2 and S3 of the multiplexer 141 are used for selecting the reference clock signal RCLK, which has no delay, one-unit delay, two-unit delay or three-unit delay.

The third delay circuit 15 comprises a multiplexer 151 and a plurality of unit delay circuits 16. In the embodiment, a 4×1 multiplexer comprising four inputs and two select signals is used for an exemplary detail description, which does not limit the scope of the present invention. The multiplexer 151 comprises a first input (pin 0), which is used to receive the feedback input clock signal DCLKIN, a second input (pin 1) coupling to the first input (pin 0) through a unit delay circuit 16, a third input (pin 2) coupling to the second input (pin 1) through a unit delay circuit 16, and a fourth input (pin 3) coupling to the third input (pin 2) through a unit delay circuit 16. The select signals S4 and S5 of the multiplexer 151 are used for selecting the feedback input clock signal DCLKIN, which has no delay, one-unit delay, two-unit delay or three-unit delay, to input to the PLL circuit 11.

Figure 1:
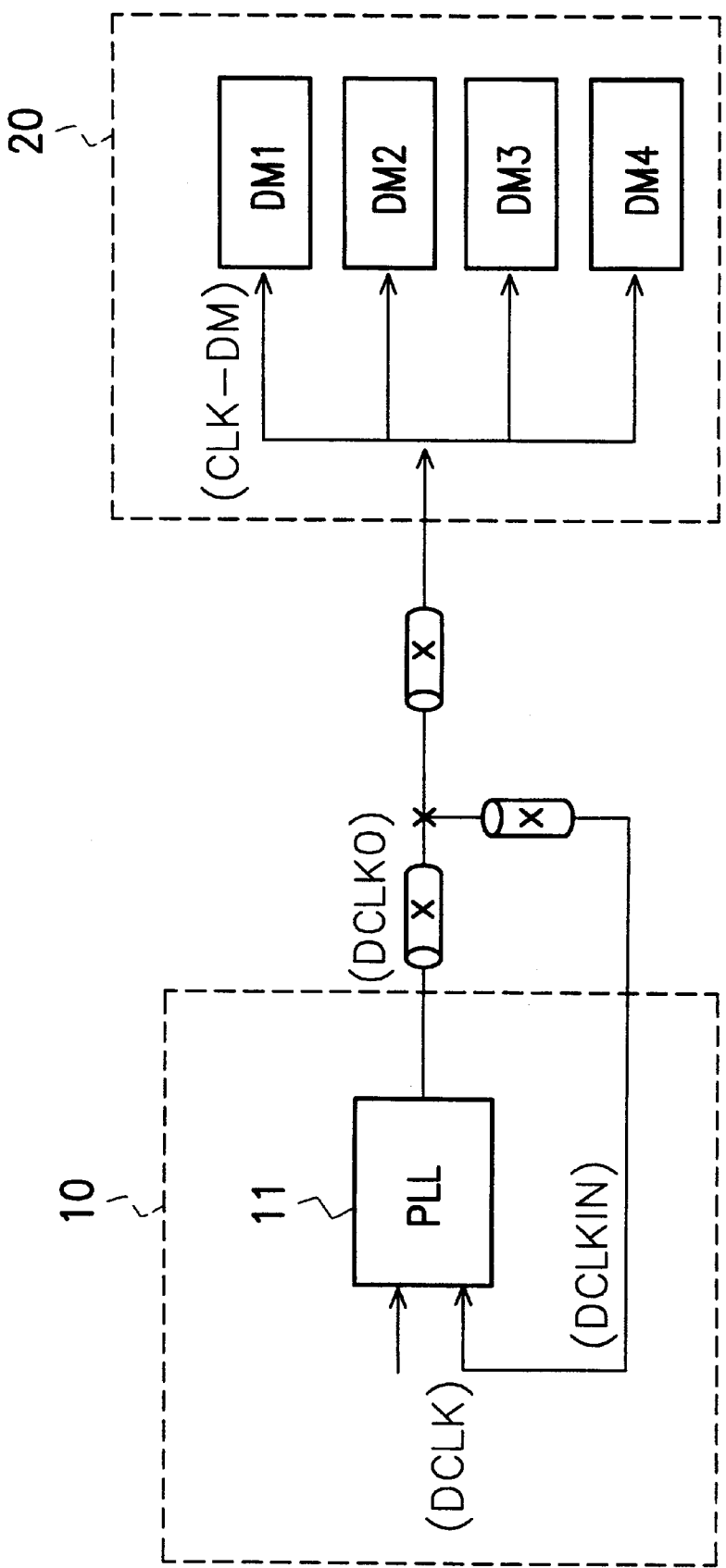
FIG. 1 is a block diagram showing the connection between the north bridge and DRAM module according to a conventional PC architecture.
Figure 2A:
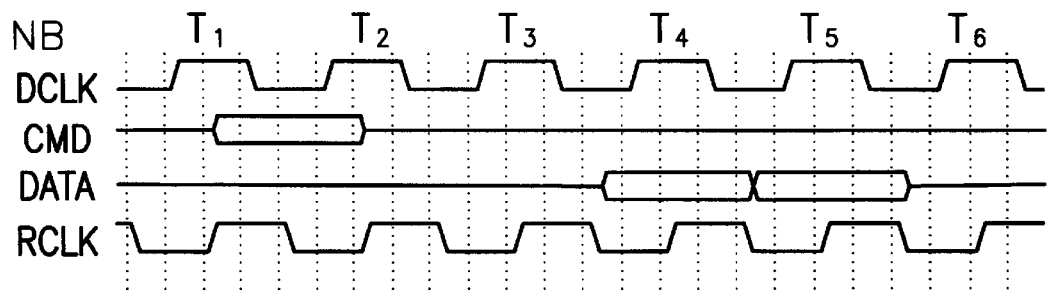
FIG. 2A is a timing diagram of the north bridge, which shows the north bridge accessing the DRAM module according to the conventional method.
Figure 2B:
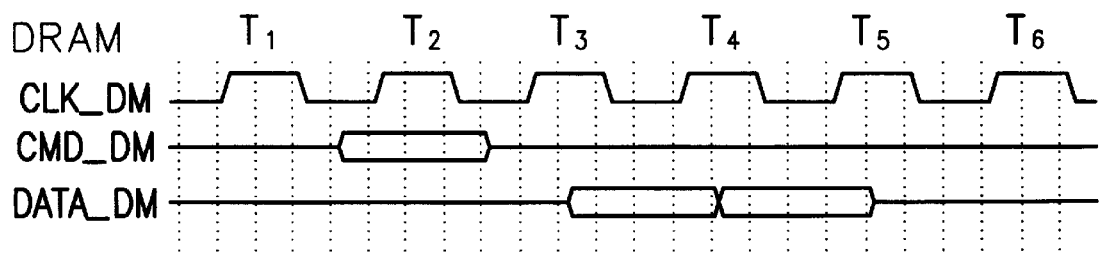
FIG. 2B is a timing diagram of the DRAM module, which shows the north bridge accessing the DRAM module according to the conventional method.
Figure 4A:
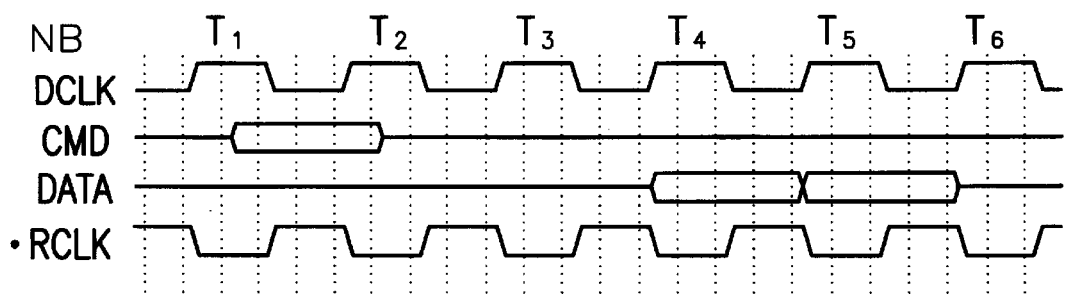
FIG. 4A is a timing diagram of the north bridge, which shows the north bridge accessing the DRAM module according to the embodiment of the present invention.
Figure 4B:
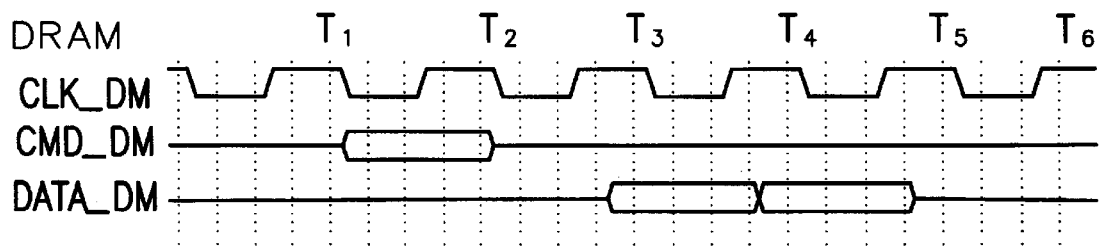
FIG. 4B is a timing diagram of the DRAM module, which shows the north bridge accessing the DRAM module according to the embodiment of the present invention.

FIG. 4A and 4B are timing diagrams of the north bridge and the DRAM module, respectively, which show the north bridge accessing the DRAM module according to the embodiment of the present invention. Referring to FIG. 3 and 4A, according to the present invention, the north bridge 10 asserts a command word CMD for reading data from the DRAM module 20 at time T1 of the command output clock signal DCLK. Referring to FIG. 4B, the memory input clock signal CLK_DM received at the DRAM module 20 is slightly delayed in phase due to the transmission delay.

As discussed above, the command output clock signal DCLK can be adequately delayed by the first delay circuit 12 according to the select signals S0 and S1, and the feedback input clock signal DCLKIN can be adequately delayed by the third delay circuit 15 according to the select signals S4 and S5. Selecting an adequate delayed signal DCLK and/or DCLKIN, the bus output clock signal DCLKO can also be adequately delayed. Therefore, there is enough setup time for DRAM module 20 to correctly encode the command word CMD_DM at the rising edge of time T2 of the memory input clock signal CLK_DM. Referring to FIG. 3 and 4B, the DRAM module 20 sends data to the north bridge 10 at time T3 of CLK$_{13}$ DM, and then the reference clock signal RCLK is adequately delayed by the second delay circuit 14 according to the select signals S2 and S3. By this, the north bridge 10 has enough setup time to read data from the DRAM module 20 at time T4 of RCLK, and then data are transferred to CPU or AGP at time T5 of RCLK.

Accordingly, the present invention provides an apparatus capable of programmably delaying a clock of a DRAM. The clock of the DRAM or the internal clock of the north bridge can be selectively delayed or not by means of the basic input output system (BIOS), external electric switches or other logic devices. Therefore, the DRAM module has enough setup time at the rising edge of work clock to correctly read out the command word. The north bridge can then correctly receive data from the DRAM module and transfer the data to the CPU or AGP.

In addition, the present invention provides a method capable of programmably delaying a clock of a DRAM. The method can apply to a chipset which comprises signals of a command output clock, a feedback input clock and a bus input clock, wherein the bus input clock signal is used as output to the DRAM.

The method comprises the steps of selecting an adequately delayed command output clock signal (DCLK), selecting an adequately delayed reference clock signal (RCLK), selecting an adequately delayed feedback input clock signal (DCLKIN), and inputting the adequately delayed DCLK and a feedback input clock signal (DCLKIN) into a PLL circuit (as shown in FIG. 3), by which an adequately delayed bus output clock signal is generated (DCLKO). Therefore, the DRAM has enough setup time at the rising edge of the memory input clock signal (CLK_DM) because of the adequately delayed DCLKO. The method for selecting the adequately delayed RCLK, DCLKIN and DCLK signals can utilize the BIOS to setup a plurality of select signals (such as S0, S1, S2, S3, S4 and S5 shown in FIG. 3). In addition, to the BIOS, external switches or other logic control devices can be also used.

Accordingly, compared with the prior art, the apparatus and method of the present invention have advantages as follows.

The present invention utilizes the BIOS, external electric switches or other logic devices to selectively delay the clock of the DRAM and/or the internal clock of the north bridge, by which the DRAM has enough setup time at the rising edge of work clock to correctly read out the command word. The north bridge can then correctly receive data from the DRAM module using RCLK and transfer the data to the CPU or AGP. Therefore, the memory can function normally even if the memory is operated at high speed or with heavy loading.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus capable of programmably delaying a clock of a memory, comprising:
   a first delay circuit for receiving a command clock signal so as to output an adequately delayed command clock signal;
   a second delay circuit, for receiving a clock signal so as to adequately delay the clock signal and generate a reference clock signal;
   a phase locked loop, coupling to an output of the first delay circuit for receiving the adequately delayed command clock signal and a feedback input clock signal so as to output a bus clock signal.

2. The apparatus of claim 1, wherein the first delay circuit further comprises:
   a plurality of unit delay circuits, wherein one input of the unit delay circuits receives the command clock signal, and an output of each of the unit delay circuits couples to an input of a next unit delay circuit; and
   a multiplexer having a plurality of inputs, wherein one input of the multiplexer couples to the command clock signal and other inputs of the multiplexer couple to the outputs of the unit delay circuits, respectively, for selecting an adequately delayed signal of the command clock signal.

3. The apparatus of claim 1, wherein the second delay circuit further comprises:
   a plurality of unit delay circuits, wherein an input of one of the unit delay circuits couples to the clock signal, and the output of each of the unit delay circuits couples to an input of a next unit delay circuit; and
   a multiplexer having a plurality of inputs, wherein one input of the multiplexer couples to the clock signal and other inputs of the multiplexer couple to the outputs of the unit delay circuits, respectively, for selecting an adequately delayed signal of the reference clock signal.

4. The apparatus of claim 1, wherein the first and second delay circuits are set up by a basic input output system (BIOS) to adequately delay the command clock signal and the clock signal.

5. The apparatus of claim 1, wherein the clock signal is the command clock signal.

6. The apparatus of claim 1, wherein the clock signal is the feedback input clock signal.

7. An apparatus capable of programmably delaying a clock of a memory, comprising:

a first delay circuit for receiving a command clock signal so as to output an adequately delayed command clock signal;

a second delay circuit, for receiving a clock signal so as to adequately delay the clock signal and generate a reference clock signal;

a third delay circuit, having an input to receive a feedback input clock signal so as to output an adequately delayed feedback input clock signal; and a phase locked loop, coupling to the first and the third delay circuits for receiving the adequately delayed command clock signal and the adequately delayed feedback input clock signal and outputting a bus clock signal.

8. The apparatus of claim 7, wherein the first delay circuit further comprises:

a plurality of unit delay circuits, wherein an input of one of the unit delay circuits couples to the command clock signal, and an output of each of the unit delay circuits couples to an input of the next unit delay circuit; and a multiplexer having a plurality of inputs, wherein one input of the multiplexer couples to the command clock signal and other inputs of the multiplexer couple to the outputs of the unit delay circuits, respectively, for selecting an adequately delayed signal of the command clock signal.

9. The apparatus of claim 7, wherein the second delay circuit further comprises:

a plurality of unit delay circuits, wherein an input of one of the unit delay circuits couples to the clock signal, and an output of each of the unit delay circuits couples to an input of a next unit delay circuit; and a multiplexer having a plurality of inputs, wherein one input of the multiplexer couples to the clock signal and other inputs of the multiplexer couple to the outputs of the unit delay circuits, respectively, for selecting an adequately delayed signal of the reference clock signal.

10. The apparatus of claim 7, wherein the third delay circuit further comprises:

a plurality of unit delay circuits, wherein an input of one of the unit delay circuits couples to the feedback input clock signal, and an output of each of the unit delay circuits couples to an input of a next unit delay circuit; and a multiplexer having a plurality of inputs, wherein one of the inputs of the multiplexer couples to the feedback input clock signal and other inputs of the multiplexer couple to outputs of the unit delay circuits, respectively, for selecting an adequately delayed signal of the feedback input clock signal.

11. The apparatus of claim 7, wherein the clock signal is the command clock signal.

12. The apparatus of claim 7, wherein the clock signal is the feedback input clock signal.

13. The apparatus of claim 7, wherein the first, second and third delay circuits are set up by a basic input output system (BIOS) to adequately delay the command clock signal, the clock signal and the feedback input clock signal.

14. A method capable of programmably delaying a clock of a memory wherein the method applies to a chipset which comprises signals of command clock, feedback input clock and bus clock, and the bus clock signal is used for outputting to the memory, the method comprising the steps of:

selecting an adequately delayed command clock signal;

selecting an adequately delayed reference clock signal;

selecting an adequately delayed feedback input clock signal; and inputting the adequately delayed command clock signal and the adequately delayed feedback input clock signal to a phase locked loop (PLL) circuit, by which an adequately delayed bus clock signal is generated so that the memory has enough setup time according to the adequately delayed bus clock signal and the adequately delayed reference clock signal.

15. The method of claim 14, wherein the steps of selecting the adequately delayed reference clock signal, feedback input clock signal and command clock signal utilize a BIOS to setup.

* * * * *